United States Patent
Jiang et al.

(10) Patent No.: US 10,579,280 B2
(45) Date of Patent: *Mar. 3, 2020

(54) ON-DIE TERMINATION CONTROL FOR MEMORY SYSTEMS (71) Applicant: MONTAGE TECHNOLOGY CO., LTD., Shanghai OT (CN)

(72) Inventors: Yibo Jiang, San Jose, CA (US); Gang Yan, San Jose, CA (US); Robert Xi Jin, San Jose, CA (US); Lizhi Jin, San Jose, CA (US); Leechung Yiu, San Jose, CA (US)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 35 days.

This patent is subject to a terminal disclaimer.

(21) Appl. No.: 16/022,650

(22) Filed: Jun. 28, 2018

(65) Prior Publication Data
US 2020/0004436 A1   Jan. 2, 2020

(51) Int. Cl.
*G06F 3/06* (2006.01)

(52) U.S. Cl.
CPC .......... *G06F 3/0617* (2013.01); *G06F 3/0658* (2013.01); *G06F 3/0683* (2013.01)

(58) Field of Classification Search
CPC .... G06F 3/0617; G06F 3/0683; G06F 3/0658; G06F 13/4086; G06F 13/1668; G06F 13/4022
See application file for complete search history.

(56) References Cited

U.S. PATENT DOCUMENTS

2014/0181429 A1* 6/2014 Malladi .................. G06F 12/00
                                                              711/154
2016/0028395 A1* 1/2016 Bains .................. H03K 19/0005
                                                               326/30

* cited by examiner

*Primary Examiner* — Tasnima Matin
(74) *Attorney, Agent, or Firm* — Jun He Law Offices P.C.; James J. Zhu (57) ABSTRACT

A memory system, comprising: a first plurality of memory ranks each having multiple memory cells; a second plurality of local controllers each coupled between one or more of the first plurality of memory ranks and a memory controller, the memory controller being configured to provide to a target local controller of the second plurality of local controllers, out of a first plurality of chip select (CS) signals, a target access CS signal enabling target access to a target memory rank of the first plurality of memory ranks coupled to the target local controller, and provide to the second plurality of local controllers, later than the target access CS signal, a command and address (CA) signal for addressing and accessing the multiple memory cells of the target memory rank; and wherein the target local controller is configured to generate, in response to receiving the target access CS signal, a target CA on-die termination (ODT) instruction switching on target CA ODT at its CA input at least for a period when the CA signal is being received from the memory controller.

18 Claims, 4 Drawing Sheets

ON-DIE TERMINATION CONTROL FOR MEMORY SYSTEMS

TECHNICAL FIELD

The application generally relates to memory technology, and particularly to a memory system and a method for accessing a memory system.

BACKGROUND

On-die termination (ODT) technology is a technology where termination resistors for impedance matching in transmission lines are located inside a semiconductor chip. ODT can reduce signal reflections resulting from signals which propagate along stub lines connecting a memory controller with components on a module card such as a dynamic random access memory (DRAM) module, thereby reducing unwanted noise introduced into the signals.

With the increase in operational frequency of memory systems, the ODT technology has been employed in memory modules such as DDR5 synchronous DRAM (SDRAM) modules. For example, ODT termination resistors may be selectively coupled to a command/address (CA) bus to switch on or off termination of the CA bus, thereby improving signal integrity thereof.

However, there is a need for further improvement to the existing memory systems.

SUMMARY

An objective of the present application is to provide a dynamic ODT mechanism for memory systems to improve performance of receiving CA signals.

In an aspect of the present application, there is provided a memory system. The memory system comprises a first plurality of memory ranks each having multiple memory cells; a second plurality of local controllers each coupled between one or more of the first plurality of memory ranks and a memory controller, the memory controller being configured to provide to a target local controller of the second plurality of local controllers, out of a first plurality of chip select (CS) signals, a target access CS signal enabling target access to a target memory rank of the first plurality of memory ranks coupled to the target local controller, and provide to the second plurality of local controllers, later than the target access CS signal, a command and address (CA) signal for addressing and accessing the multiple memory cells of the target memory rank; and wherein the target local controller is configured to generate, in response to receiving the target access CS signal, a target CA on-die termination (ODT) instruction switching on target CA ODT at its CA input at least for a period when the CA signal is being received from the memory controller.

In an embodiment, each local controller is coupled to two memory ranks of the first plurality of memory ranks, and the target local controller is configured to generate the target CA ODT instruction when either or both of the two memory ranks are enabled for target access.

In an embodiment, the CA signal is received by the target local controller N clock cycles later than the target access CS signal to allow generation of the target CA ODT instruction before receiving of the CA signal, wherein N is a positive integer. N may be a programmable value.

In an embodiment, the target CA ODT instruction switches on the target CA ODT at the CA input of the target local controller from a setup time prior to the receiving of the CA signal till a hold time after the receiving of the CA signal.

In an embodiment, the memory controller is further configured to provide to a non-target local controller of the second plurality of local controllers, out of the first plurality of CS signals, non-target access CS signals disabling target access to all non-target memory ranks of the first plurality of memory ranks coupled to the non-target local controller; wherein the non-target local controller is configured to generate, in response to receiving the non-target access CS signals, a non-target CA ODT instruction switching on non-target CA ODT at its CA input at least for a period when the CA signal is being received from the memory controller.

In an embodiment, the memory system comprises the memory controller.

In an embodiment, the memory system further comprises a second plurality of registering clock drivers (RCDs), and each of the second plurality of local controllers is integrated within one of the second plurality of RCDs.

In an embodiment, each of the second plurality of local controllers is integrated within one of the first plurality of memory ranks.

In another aspect of the present application, there is provided a memory controller for use with a memory system, comprising a first plurality of memory ranks each having multiple memory cells and a second plurality of local controllers each coupled between one or more of the first plurality of memory ranks and the memory controller, wherein the memory controller is configured to perform: providing to a target local controller of the second plurality of local controllers, out of a first plurality of CS signals, a target access CS signal enabling target access to a target memory rank of the first plurality of memory ranks coupled to the target local controller, and providing to the second plurality of local controllers, later than the target access CS signal, a CA signal for addressing and accessing the multiple memory cells of the target memory rank.

In a further embodiment of the present application, there is provided a method for accessing a memory system, wherein the memory system comprises a first plurality of memory ranks each having multiple memory cells, a second plurality of local controllers each coupled between one or more of the first plurality of memory ranks, and a memory controller; wherein the method comprises: providing from the memory controller to a target local controller of the second plurality of local controllers, out of a first plurality of CS signals, a target access CS signal enabling target access to a target memory rank of the first plurality of memory ranks coupled to the target local controller; generating, via the target local controller, a target CA ODT instruction switching on target CA ODT at its CA input in response to the target local controller receiving the target access CS signal; and providing from the memory controller to the second plurality of local controllers, later than the target access CS signal, a CA signal for addressing and accessing the multiple memory cells of the target memory rank; wherein the target CA ODT at the CA input of the target local controller is switched on by the target CA ODT instruction at least for a period when the CA signal is being received from the memory controller.

The foregoing is an overview of the present application, which may simplify, summarize, and omit details. Those skilled in the art will appreciate that this section is merely illustrative and not intended to limit the scope of the present application in any way. This summary section is neither intended to identify key features or essential features of the claimed subject matter nor intended to act as an auxiliary means for determining the scope of the claimed subject matter.

BRIEF DESCRIPTION OF THE DRAWINGS

The foregoing and other features of the present application will be more fully understood from the following description and the appended claims taken in conjunction with the accompanying drawings. It is to be understood that these drawings depict only a few embodiments of the contents of the present application and should not be construed as limiting the scope of the present application. The contents of the present application will be illustrated more clearly and in more detail with the accompanying drawings.

DETAILED DESCRIPTION OF THE EMBODIMENTS

In the following detailed description, reference is made to the accompanying drawings which form a part hereof. In the drawings, similar reference numerals generally refer to similar parts unless the context clearly dictates otherwise. The illustrative embodiments described in the detailed description, drawings and claims are not intended to be limiting. Other embodiments may be employed and other changes may be made without departing from the spirit or scope of the subject matter of the present application. It is to be understood that various configurations, substitutions, combinations and designs of the various forms of the present application, which are generally described in this application and are illustrated in the drawings, are intended to constitute a part of the present application.

Figure 1:
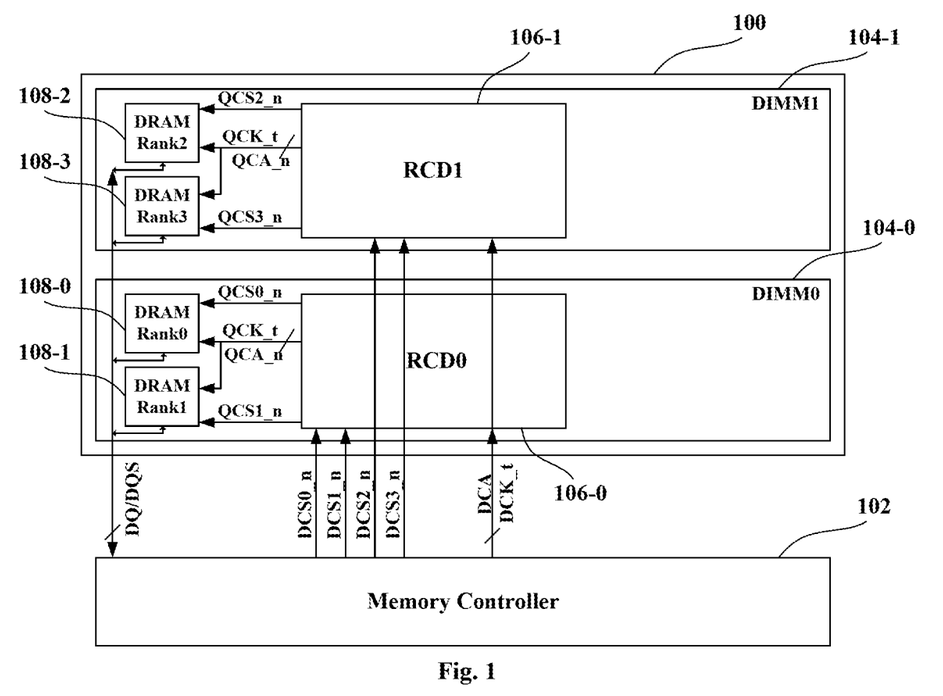
FIG. 1 shows a memory system 100 according to an embodiment of the present application.

FIG. 1 shows a memory system 100 according to an embodiment of the present application. The memory system 100 may be coupled to a memory controller 102 such as a central processing unit to exchange data with the memory controller 102. Specifically, the memory controller 102 may access to the memory system 100 by providing, for example, a write instruction of writing data into the memory system 100, or a read instruction of reading data from the memory system 100. In certain embodiments, the memory system 100 may be a memory system in accordance with the JEDEC double data rate synchronous dynamic random access memory (DDR SDRAM) standard, including the JEDEC DDR2, DDR3, DDR4, DDR5, LPDD3, LPDDR4, LPDDR5 or any other DDR standards, for example.

In an embodiment, as shown in FIG. 1, the memory system 100 includes a plurality of DIMM memory modules such as DIMM memory modules 104-0 and 104-1, which store data therein during operation. It can be appreciated that the number of the DIMM memory modules may be greater than 2 in other embodiments. Moreover, each DIMM memory module may include at least one DRAM memory rank, and a local controller such as a registering clock driver (RCD) coupled between the at least one DRAM memory rank and the memory controller 102. For example, the memory module 104-0 includes DRAM memory ranks 108-0 and 108-1, and an RCD 106-0. It can be appreciated that the number of DRAM memory ranks included in a memory module may be a positive integer other than 2 in other embodiments. The memory module 104-1 includes DRAM memory ranks 108-2 and 108-3, and an RCD 106-1. The local controller here refers to a control logic or circuit on the memory module, such as those disposed on a printed circuit board of the memory module and interfacing with the memory controller via a memory interface. In some embodiments, the local controller may be integrated within the RCD, or may not be integrated within the RCD. In some other embodiments, the local controller may be integrated with the memory ranks, such that the memory controller 102 can access to the memory ranks directly without buffering access commands and/or other control instructions via the RCD. In the following, the application will be elaborated with reference to the exemplary memory system 100 where the local controller is integrated within the memory modules, however, such description is for illustrative purpose only, and should not limit the scope of the application.

Specifically, the memory controller 102 is coupled to the RCDs (RCD 106-0 and RCD 106-1 in the embodiment shown in FIG. 1) via a DCA bus for providing a command/address (CA) signal which indicates specific access operation (e.g. write, read, select, deselect, etc.) instructions to the memory ranks, and a DCK_t clock bus for providing a clock signal for synchronizing the CA signal and some other signals provided to the RCDs 106-0 and 106-1. Both of the RCDs 106-0 and 106-1 have a CA input coupled to the DCA bus and for receiving the CA signal. The RCDs 106-0 and 106-1 may forward the received CA signal and clock signal to the memory ranks 108-0 to 108-3 via their respective QCA_n lines and QCK_t lines, to instruct to the memory ranks 108-0 to 108-3 how to proceed. It can be appreciated that the clock signal may be transmitted via the DCK_t bus and then the QCK_t lines, and in some other embodiments, the clock signal may be in form of a differential signal and can be transmitted via respective buses and signal lines.

In addition, the memory controller 102 is further coupled to the RCDs (RCD 106-0 and RCD 106-1 in the embodiment shown in FIG. 1) via respective DCSi_n (DCS0_n to DCS3_n in the embodiment shown in FIG. 1) lines for providing chip select (CS) signals (not shown) thereto, wherein i is a positive integer. The CS signal may enable or disable target access to a specific memory rank of the plurality of memory ranks. For example, the RCD 106-0 is coupled to the memory controller 102 via the DCS0_n and DCS1_n lines. The RCDs 106-0 and 106-1 may further forward the received CS signals to the memory ranks 108-0 to 108-3 via respective QCSi_n lines (QCS0_n to QCS3_n in the embodiment shown in FIG. 1). Each memory rank is controlled by the CS signal on the corresponding QCSi_n line outputted by the RCD coupled thereto. During operation, a memory rank enabled for target access by the memory controller 102 via the respective RCD may be referred to as a target memory rank, the corresponding CS signal may be referred to as a target access CS signal, and the RCD coupled to the target memory rank may be referred to as a target RCD. It can be seen that, in the embodiment shown in FIG. 1, each RCD is coupled to two memory ranks. Accordingly, when either or both of the memory ranks coupled to a single RCD are enabled by the corresponding CS signals for target access, the RCD is a target RCD. On the other hand, a memory rank disabled for target access by the memory controller via the respective RCD may be referred to as a non-target memory rank, and the corresponding CS signal may be referred to as a non-target access CS signal. Accordingly, when both of the memory ranks coupled to an RCD are disabled by the corresponding CS signals for target access, the RCD may be referred to as a non-target RCD.

All the memory ranks 108-0 to 108-3 are further coupled to the memory controller 102 via a two-way DQ/DQS data bus, through which data can be written into the target memory rank via the DQ/DQS data bus during a write operation instructed by the target RCD, or read from the target memory rank to the memory controller 102 via the DQ/DQS data bus during a read operation instructed by the target RCD. JEDEC standards including DDR4 SDRAM (JESD79-4B) standard published in June 2017, DDR4 Registering Clock Driver-DDR4RCD01 (JESD82-31) standard published in August 2016, Low Power Double Data Rate 4 (JESD209-4B) standard published in February 2017 and etc. have provided more details regarding access operations for memory systems in accordance with the DDR standard, which are incorporated herein as their entirety by reference.

Since data communication between the memory modules 104-0 and 104-1 and the memory controller 102 may operate at a very high operational frequency such as 2400 MHz or higher, ODT can be applied to the signal buses (e.g. the DCA bus and the DQ/DQS bus) between the memory modules 104-0 and 104-1 and the memory controller 102 to improve signal integrity and reduce signal reflections on these buses. The inventors of the present application found that conventional static ODT for the CA bus does not work well during certain access operations. Accordingly, a new dynamic ODT for the CA bus is provided here, which can be implemented on the memory system 100 shown in FIG. 1, for example.

Figure 2:
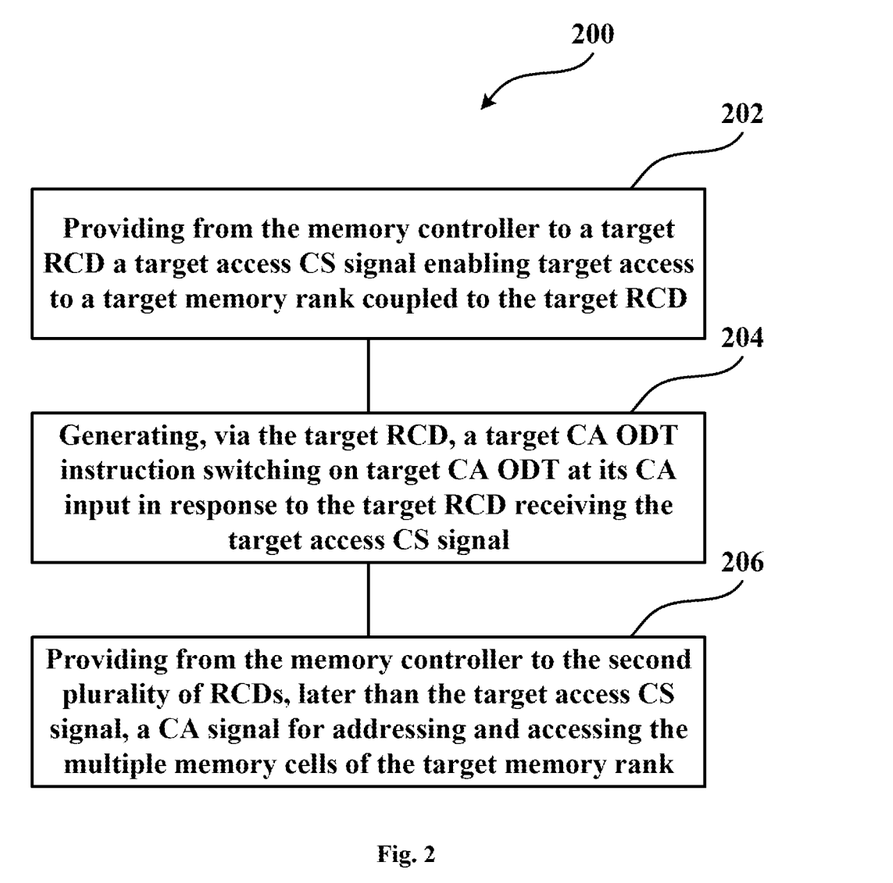
FIG. 2 shows a method 200 for accessing to a memory system according to an embodiment of the present application.
Figure 3:
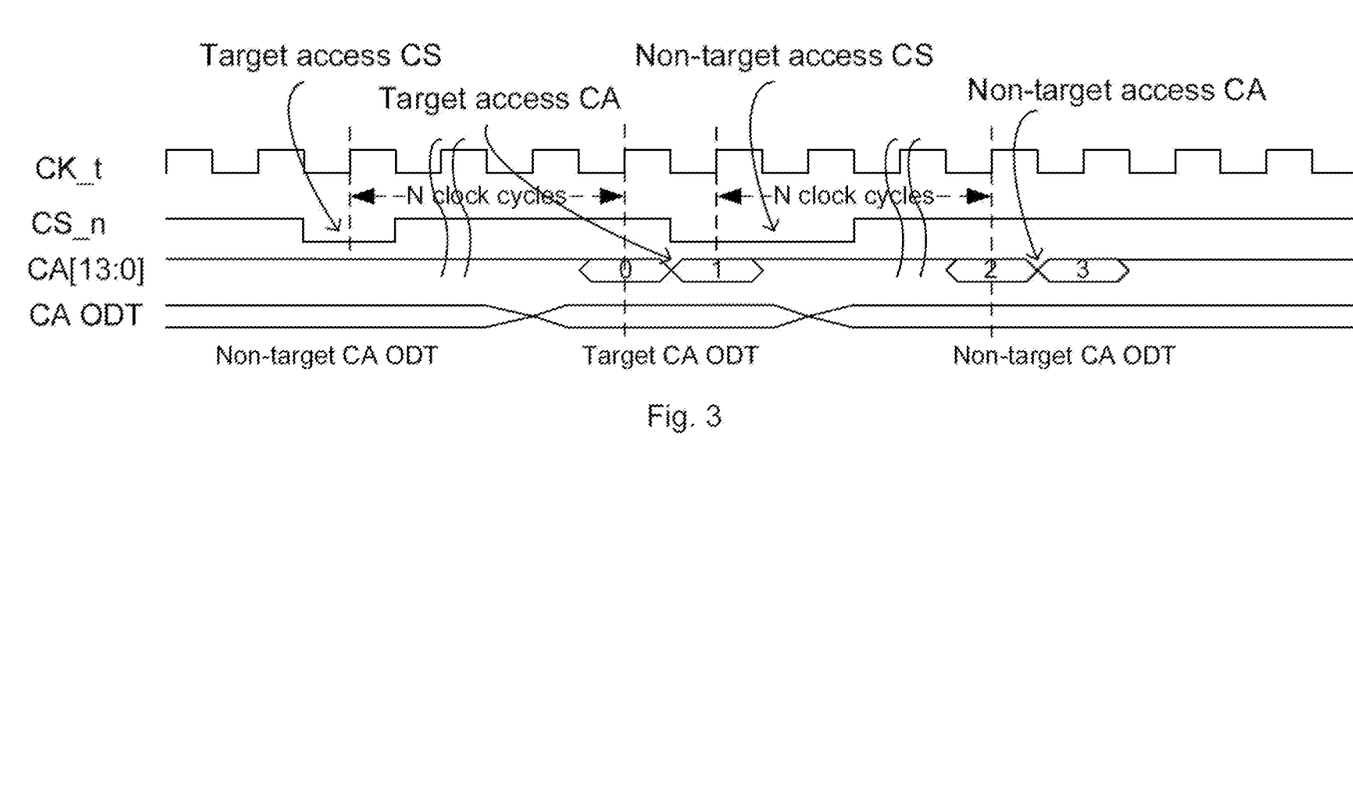
FIG. 3 shows an exemplary timing diagram for signals on a portion of the signal line/buses of the memory system shown in FIG. 1 according to the method shown in FIG. 2.

FIG. 2 shows a method 200 for accessing to a memory system according to an embodiment of the present application. The method 200 employs CA ODT for a CA bus and can be implemented on the memory system 100 shown in FIG. 1. FIG. 3 shows a timing diagram for signals on a portion of the signal line/buses of the memory system 100 according to the method 200.

In the following, the method 200 will be elaborated with reference to FIGS. 1 to 3.

In particular, at step 202, a target access CS signal targeting the memory rank 108-0 out of a set of CS signals is provided from the memory controller 102 to the RCD 106-0 via the DSC0_n line. The other CS signals of the set of CS signals may be non-target access CS signals, which may disable the non-target memory ranks for target access. In the example shown in FIG. 3, the target access CS signal on the DSC0_n line is active low phase (the active level is low level while the inactive level is high level) when indicating target access to the memory rank 108-0. It can be appreciated the target access CS signal may be active high phase when indicating target access, for example, for a memory system in accordance with the LPDDR5 standard. The target access CS signal on the DCS0_n line may be forwarded to the memory rank 108-0 at a later stage to enable target access to the memory rank 108-0.

At step 204, upon receiving the target access CS signal, the target RCD 106-0 may generate, according to the target access CS signal, a target CA ODT instruction to switch on target CA ODT at its CA input which is coupled to the DCA bus. The generation of the ODT instruction is later than receiving of the target access CS signal since it is based on the received target access CS signal. For example, the target RCD which has received the target access CS signal may include a decoder. The decoder may decode the target access CS signal into the target CA ODT instruction for switching on the target CA ODT. In the embodiment shown in FIG. 1, the target CA ODT instruction may be an internal instruction of the target RCD(s) and not be provided to other components such as the target memory rank(s). In some other embodiments where the local controller is not integrated within the RCD or is integrated within the memory rank, the decoder may be formed with other components of the local controller as an individual sub-module of the memory module, or may be integrated within the memory rank; and accordingly, the target CA ODT can be provided to the CA inputs of these components to switch on the target CA ODT for these components.

In certain embodiments, the dynamic ODT mechanism can also be employed to an RCD when non-target access CS signal(s) is received for the memory rank(s) coupled to the RCD. Specifically, when the RCD has received the non-target access CS signals, the decoder of the RCD may decode the non-target access CS signals into a non-target CA ODT instruction for switching on non-target CA ODT for its CA input. The target CA ODT and non-target CA ODT are both ODT for the CA bus, with a difference in the resistance of the termination resistor switched to for termination.

TABLE I

Full Combination of DCS0_n and DCS1_n Coding

| DCS0_n | | DCS1_n | | Legal | DCA | |
|---|---|---|---|---|---|---|
| 1st cycle | 2nd cycle | 1st cycle | 2nd cycle | or Illegal | ODT value | Note |
| 0 | 0 | 0 | 0 | Legal | Non-target CA ODT | Non-target access |
| 0 | 0 | 0 | 1 | Legal | Target CA ODT | Target access to Rank1 |
| 0 | 0 | 1 | 0 | Illegal | N/A | N/A |
| 0 | 0 | 1 | 1 | Legal | Non-target CA ODT | Non-target access |
| 0 | 1 | 0 | 0 | Legal | Target CA ODT | Target access to Rank0 |
| 0 | 1 | 0 | 1 | Legal | Target CA ODT | Target access to both Rank0 and Rank1 |
| 0 | 1 | 1 | 0 | Illegal | N/A | N/A |
| 0 | 1 | 1 | 1 | Legal | Target CA ODT | Target access to Rank0 |
| 1 | 0 | 0 | 0 | Illegal | N/A | N/A |
| 1 | 0 | 0 | 1 | Illegal | N/A | N/A |
| 1 | 0 | 1 | 0 | Illegal | N/A | N/A |
| 1 | 0 | 1 | 1 | Illegal | N/A | N/A |
| 1 | 1 | 0 | 0 | Legal | Non-target CA ODT | Non-target access |
| 1 | 1 | 0 | 1 | Legal | Target CA ODT | Target access to Rank1 |
| 1 | 1 | 1 | 0 | Illegal | N/A | N/A |
| 1 | 1 | 1 | 1 | Legal | Non-target CA ODT | Non-target access |

Table I above shows a full combination of DCS0_n and DCS1_n coding for the memory system shown in FIG. 1. Both of the DCS0_n and DCS1_n lines are coupled to the RCD 106-0 shown in FIG. 1. And the memory system can be a memory system in accordance with the DDR5 standard and other future DDR standards where the CS signal is a two-clock cycle wide signal and active low phase. The CA signal may also be a two-clock cycle wide signal, with each signal line of the CA bus transmitting one-bit data during each clock cycle, as is shown in FIG. 3. For a memory system without an RCD for buffering the CA signal, i.e. memory modules of the memory systems are directly accessed by the memory controller, each memory module may have a CA[13:0] bus having 14 signal lines, and thus a total of at most 28 bits can be transmitted via the CA[13:0] bus during each two clock cycles. The at most 28 bits data forms the data access instruction and access address required for a data access operation. Moreover, the CS signal and the CA signal, both of which are two-clock cycle wide signals, can be aligned to the clock signal provided at the CK_t bus respectively, to pass necessary chip select instruction, data access instruction, access address and etc. to the memory module. For a memory system with an RCD, as is shown in FIG. 1, the RCD may have a DCA[6:0] bus for receiving the CA signal from the memory controller and a QCA[13:0] bus for outputting the CA signal buffered. Accordingly, the CA signal may carry four bits on each signal line of the DCA[6:0] bus during each two cycles (i.e. two bits for each cycle including one bit in the first half and another bit in the second half) to ensure that a total of at most 28 bits can be outputted to the corresponding memory rank via the QCA[13:0] bus of the RCD. Moreover, for a LPDDR5 memory system which uses one-clock cycle CA signal carrying a CA instruction and does not have an RCD for buffering the CA signal, each signal line of a CA[6:0] bus coupled to a memory module of the memory system can transmit two-bit data during a clock cycle, i.e. one bit is transmitted during a first half of the clock cycle and another bit is transmitted during a second half of the clock cycle, thereby a total of at most 14 bits can be transmitted via the CA[6:0] bus during each clock cycle (see FIG. 4). It should be noted that the number of signal lines included in a CA bus (DCA/QCA) does not limit the scope of the application.

As shown in Table I, when a value of "10" is received on either or both of the DCS0_n and the DCS1_n lines within two consecutive clock cycles, such CS signal is illegal. Other than that, when a value "01" is received on the DCS1_n line within two consecutive clock cycles, a target access to the memory rank 108-1 will be performed; and when a value "01" is received on the DCS0_n line within two consecutive clock cycles, a target access to the memory rank 108-0 will be performed. In such condition, the target CA ODT may be switched on for the RCD 106-0. Furthermore, when a value "00" or "11" is received on both of the DCS0_n and DCS1_n lines within two consecutive clock cycles, a non-target access to the memory ranks 108-0 and 108-1 will be performed. Accordingly, the non-target CA ODT may be switched on for the RCD 106-0.

Still referring to FIGS. 1 and 2, at step 206, a CA signal for addressing and accessing the multiple memory cells of the target memory rank 108-0 is provided from the memory controller 102 to the RCDs 106-0 to 106-1 via the DCA bus, later than the target access CS signal.

As described above, the target RCD needs sometime to generate, by decoding the target access CS signal or otherwise, the target CA ODT instruction after receiving the target access CS signal. If the CA signal is transmitted from the memory controller to the target RCD simultaneously with the target access CS signal, at least at the beginning of the target RCD receiving the CA signal, the target CA ODT cannot work and may introduce unwanted noise into the received CA signal. Thus, at step 206, the CA signal is provided later than the target access CS signal, to allow sufficient time for the target RCD to generate the target CA ODT instruction. For example, the CA signal may be provided to the target RCD N clock cycles (of the clock signal on the DCK_t bus) later than the target access CS signal on the DSC0_n line, wherein N is a positive integer. In some examples, N may be a programmable value, which is programmable according to a processing capability of the RCDs of the memory system. For example, if the RCDs have stronger signal processing capability, then N can be set to be a smaller value; otherwise N may be set to be a bigger value to allow sufficient time for the RCD to generate the target CA ODT instruction.

In this way, the receiving of the CA signal by the target RCD should be always no earlier than switching on the target CA ODT for the target RCD. Furthermore, the target CA ODT should be maintained at least for a period when the CA signal is being received by the target RCD. In some preferred embodiments, the target CA ODT instruction may switch on the target CA ODT for the target RCD a setup time prior to the receiving of the CA signal by the RCD till a hold time after the receiving of the CA signal. Accordingly, the target CA ODT can be maintained stable during the whole process of receiving the CA signal.

As described above, an RCD may receive non-target access CS signals at all its DCSi_n inputs, and accordingly the RCD is a non-target RCD. For the non-target RCD, the non-target CA ODT may be switched on at its CA input. In some embodiments, the non-target CA ODT may be set as a default ODT and be switched to target CA ODT unless a target access CS signal is received. Except the target CA ODT switched on for receiving of the CA signal, the CA ODT is set as the non-target CA ODT.

Figure 4:
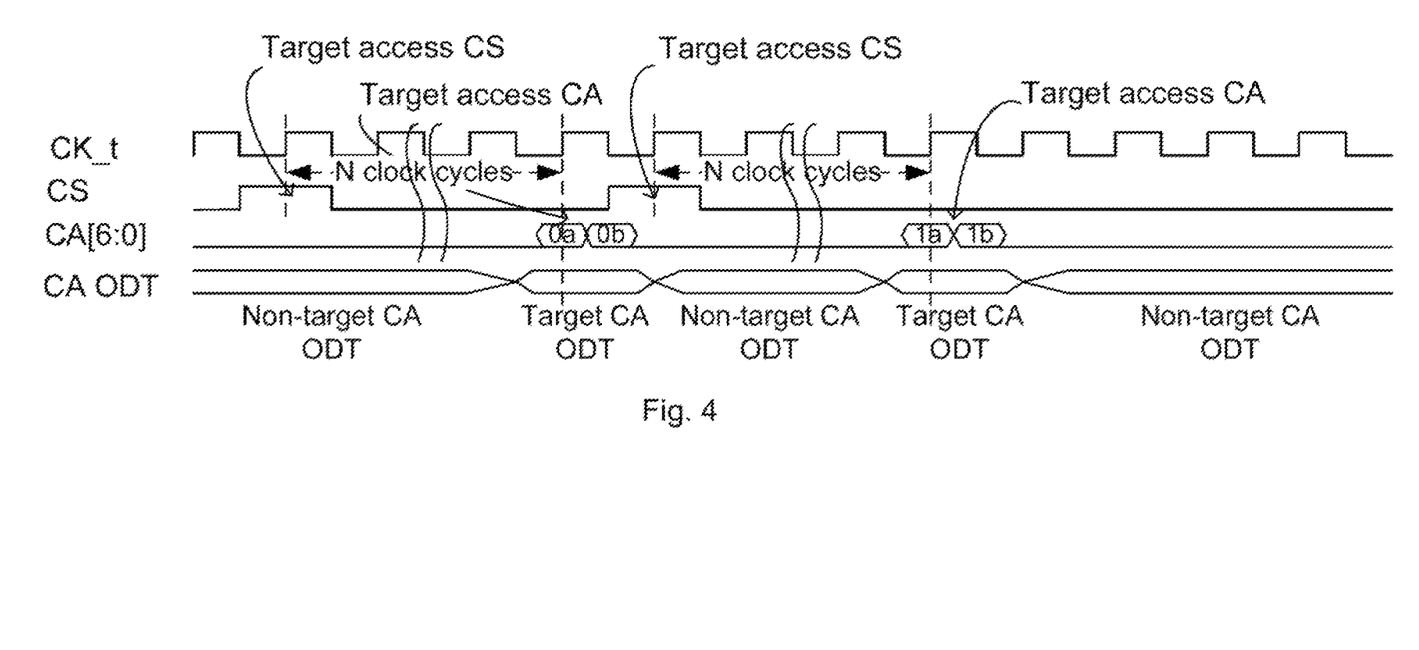
FIG. 4 shows another exemplary timing diagram for signals on a portion of the signal line/buses of the memory system shown in FIG. 1 according to the method shown in FIG. 2.

In the embodiment shown in FIG. 3, both the target access CS signal and the non-target access CS signal are two-clock cycle wide in accordance with the DDR5 standard for example. FIG. 4 shows a timing diagram for signals on a portion of the signal line/buses of a memory system in accordance with the LPDDR5 standard. Specifically, the target access and non-target access CS signals are one-clock cycle signals and active high phase. The CA signal is also transmitted within a clock cycle. The target CA ODT and non-target CA ODT setting for the memory system is similar to that of the memory system in accordance with the DDR5 standard, which will not be elaborated herein.

It should be noted that although several steps of the method for accessing a memory system and several modules or sub-modules of the memory system are described in the above description, this division is merely exemplary rather than mandatory. In fact, according to the embodiments of the present application, features and functions of two or more modules described above may be embodied in one module. Conversely, features and functions of one module described above can be further divided into a plurality of modules.

Those skilled in the art will be able to understand and implement other variations to the disclosed embodiments by studying the specification, the application, the drawings and the appended claims. In the claims, the words "include" or "including" do not exclude other elements and steps, and the words "a" or "an" do not exclude the plural. In the practical application of the present application, one part may perform the functions of a plurality of technical features cited in the claims. Any reference numerals in the claims should not be construed as limiting the scope.

What is claimed is:

1. A memory system, comprising:
   a plurality of memory ranks each having multiple memory cells;
   multiple local controllers each coupled between one or more of the plurality of memory ranks and a memory controller,
   the memory controller being configured to provide to a target local controller of local controllers, out of a plurality of chip select (CS) signals, a target access CS signal enabling target access to a target memory rank of the plurality of memory ranks coupled to the target local controller, and provide to the local controllers, later than the target access CS signal, a command and address (CA) signal for addressing and accessing the multiple memory cells of the target memory rank; and wherein the target local controller is configured to generate, in response to receiving the target access CS signal, a target CA on-die termination (ODT) instruction switching on target CA ODT at its CA input at least for a period when the CA signal is being received from the memory controller.

2. The memory system of claim 1, wherein each local controller is coupled to two memory ranks of the plurality of memory ranks, and the target local controller is configured to generate the target CA ODT instruction when either or both of the two memory ranks are enabled for target access.

3. The memory system of claim 1, wherein the CA signal is received by the target local controller N clock cycles later than the target access CS signal to allow generation of the target CA ODT instruction before receiving of the CA signal, wherein N is a positive integer.

4. The memory system of claim 3, wherein N is a programmable value.

5. The memory system of claim 1, wherein the target CA ODT instruction switches on the target CA ODT at the CA input of the target local controller from a setup time prior to the receiving of the CA signal till a hold time after the receiving of the CA signal.

6. The memory system of claim 1, wherein the memory controller is further configured to provide to a non-target local controller of the local controllers, out of the plurality of CS signals, non-target access CS signals disabling target access to all non-target memory ranks of the plurality of memory ranks coupled to the non-target local controller;

wherein the non-target local controller is configured to generate, in response to receiving the non-target access CS signals, a non-target CA ODT instruction switching on non-target CA ODT at its CA input at least for a period when the CA signal is being received from the memory controller.

7. The memory system of claim 1, wherein the memory system comprises the memory controller.

8. The memory system of claim 1, wherein the memory system further comprises multiple registering clock drivers (RCDs), and each of the local controllers is integrated within one of the RCDs.

9. The memory system of claim 1, wherein each of the local controllers is integrated within one of the plurality of memory ranks.

10. A memory controller for use with a memory system comprising a plurality of memory ranks each having multiple memory cells and multiple local controllers each coupled between one or more of the plurality of memory ranks and the memory controller, wherein the memory controller is configured to perform:

providing to a target local controller of the local controllers, out of a plurality of CS signals, a target access chip select (CS) signal enabling target access to a target memory rank of the plurality of memory ranks coupled to the target local controller; and providing to the local controllers, later than the target access CS signal, a command and address (CA) signal for addressing and accessing the multiple memory cells of the target memory rank;

wherein the CA signal is provided to the target local controller N clock cycles later than the target access CS signal to allow the target local controller to generate a target CA on-die termination (ODT) instruction switching on target CA ODT at its CA input at least for a period when the CA signal is being received, wherein N is a positive integer.

11. A method for accessing a memory system by a memory controller, wherein the memory system comprises a plurality of memory ranks each having multiple memory cells, and multiple local controllers each coupled between one or more of the plurality of memory ranks and the memory controller; wherein the method comprises:

providing from the memory controller to a target local controller of the local controllers, out of a plurality of chip select (CS) signals, a target access CS signal enabling target access to a target memory rank of the plurality of memory ranks coupled to the target local controller;

generating, via the target local controller, a target CA on-die termination (ODT) instruction switching on target CA ODT at its CA input in response to the target local controller receiving the target access CS signal; and providing from the memory controller to the local controllers, later than the target access CS signal, a command and address (CA) signal for addressing and accessing the multiple memory cells of the target memory rank;

wherein the target CA ODT at the CA input of the target local controller is switched on by the target CA ODT instruction at least for a period when the CA signal is being received from the memory controller.

12. The method of claim 11, wherein each local controller is coupled to two memory ranks of the plurality of memory ranks, and the target CA ODT instruction is generated by the target local controller when either or both of the two memory ranks are enabled for target access.

13. The method of claim 11, wherein the CA signal is provided from the memory controller to the local controllers N clock cycles later than the target access CS signal to allow generation of the target CA ODT instruction by the target local controller before receiving of the CA signal, wherein N is a positive integer.

14. The method of claim 13, wherein N is a programmable value.

15. The method of claim 11, wherein the target CA ODT at the CA input of the target local controller is switched on by the target CA ODT instruction from a setup time prior to the target local controller receiving of the CA signal till a hold time after the target local controller receiving of the CA signal.

16. The method of claim 11, further comprising:

providing from the memory controller to a non-target local controller of the local controllers, out of the plurality of CS signals, non-target access CS signals disabling target access to all non-target memory ranks of the plurality of memory ranks coupled to the non-target local controller; and generating, via the non-target local controller, a non-target CA ODT instruction switching on non-target CA ODT at its CA input at least for a period when the CA signal is being received by the non-target local controller in response to the non-target local controller receiving the non-target access CS signals.

17. The method of claim 11, wherein the memory system further comprises multiple registering clock drivers (RCDs), and each of the local controllers is integrated within one of the RCDs.

18. The method of claim 11, wherein each of the local controllers is integrated within one of the plurality of memory ranks.

\* \* \* \* \*